(12) United States Patent
Reis et al.

(10) Patent No.: US 7,592,695 B2
(45) Date of Patent: Sep. 22, 2009

(54) COMPOUND HEAT SINK

(75) Inventors: Bradley E. Reis, Westlake, OH (US);
Julian Norley, Chagrin Falls, OH (US);
Prathib Skandakumaran, Cleveland, OH (US)

(73) Assignee: GrafTech International Holdings Inc., Parma, OH (US)

( * ) Notice: Subject to any disclaimer, the term of this patent is extended or adjusted under 35 U.S.C. 154(b) by 168 days.

(21) Appl. No.: 11/609,121

(22) Filed: Dec. 11, 2006

(65) Prior Publication Data
US 2008/0137304 A1    Jun. 12, 2008

(51) Int. Cl.
*H01L 23/10* (2006.01)

(52) U.S. Cl. .................. 257/706; 257/711; 257/712; 257/713; 257/714; 257/722; 257/E33.075; 257/E31.131; 257/E23.051; 257/E23.098; 257/E23.101; 257/E23.103; 361/702; 361/703; 361/704; 361/706; 361/708; 361/709; 165/80.3; 165/185; 174/16.3

(58) Field of Classification Search .......... 257/276, 257/625, 675, 706, 708, 712–722, 796, E33.075, 257/E31.131, E23.051, E23.08–E23.113; 438/122, FOR. 31.131; 361/702–709; 165/80.3, 165/904, 905, 185; 174/16.3
See application file for complete search history.

(56) References Cited

U.S. PATENT DOCUMENTS

| | | | |
|---|---|---|---|
| 3,404,061 A | 10/1968 | Shane et al. ................. 161/125 |
| 4,895,713 A | 1/1990 | Greinke et al. .............. 423/448 |
| 5,406,698 A | 4/1995 | Lipinski ....................... 29/727 |
| 5,902,762 A | 5/1999 | Mercuri et al. ................ 501/99 |
| 6,114,761 A * | 9/2000 | Mertol et al. ................ 257/722 |
| 6,613,252 B2 | 9/2003 | Norley et al. .............. 264/37.1 |
| 7,108,055 B2 * | 9/2006 | Krassowski et al. ......... 165/185 |

* cited by examiner

*Primary Examiner*—Jasmine J Clark
(74) *Attorney, Agent, or Firm*—Waddey & Patterson, PC; James R. Cartiglia

(57) ABSTRACT

A compound heat sink for the removal of thermal energy useful for, inter alia, electronic devices or other components. The compound heat sink includes a die cast base element; an extruded dissipation element having a thermal conductivity of at least about 150 W/m-K; and a thermal connection material positioned between and in thermal contact with each of the base element and the dissipation element, wherein the thermal connection material having an in-plane thermal conductivity greater than the thermal conductivity of the dissipation element.

24 Claims, 2 Drawing Sheets

COMPOUND HEAT SINK

BACKGROUND OF THE INVENTION

1. Technical Field

The present invention relates to a heat sink useful for optimizing heat dissipation from electronic components. More particularly, the present invention relates to a multi-element heat sink with improved characteristics for dissipating heat from electronic components such as power amplifiers so that the components are reduced to a lower temperature state.

2. Background Art

With the advancement of electronic devices being produced for many different applications, for many different locations, cooling electronic devices have become a substantial industry. For instance, in devices such as power amplifiers for tower-mounted infrastructures, cooling is essential to maintain the effective operation of the device. Moreover, the performance of components of computing devices decreases unless sufficient thermal energy is removed from the unit. Semiconductors also suffer in that their performance deteriorates when the operating temperature increases to an undesired level around the semiconductor device.

The traditional method of cooling an electronic device is by using a fan to circulate air around the electronic device, and thus remove thermal energy. Unfortunately, the problems associated with fan-type technology are multiple, including a relatively low cooling efficiency, a bulky power source and a limited functional size. Furthermore, in applications such as tower mounted infrastructures, fan-type technology is undesirable because of the weight of fan technology and further because fan failure can have extremely disadvantageous effects. Thus, passive cooling is most desired in such applications. Methods have developed to replace fan-type cooling devices which are both smaller and located in the immediate vicinity of the electronic device needing to be cooled. One purpose of the present invention is to provide a heat management device which can eliminate the use of fans, but more generally, it is to provide a more efficient heat sink for use in situations where heat sink performance is limited by spreading in the base of the heat sink, allowing reduction of airflow requirements or lower thermal resistance for a given airflow or in natural convection.

One popular method for the dissipation of heat from modern electronics is an aluminum heat sink. While aluminum does not have the thermal conductivity of copper, it is significantly lighter in weight (having a density of about 2.7 g/cc as opposed to 8.9 g/cc for pure copper). Thus, for portable applications like laptop computers or stationary applications where weight supporting structures are undesirable, aluminum has been preferred. In addition, aluminum heat sinks tend to be substantially less expensive than copper heat sinks.

Generally, aluminum heat sinks are formed by one of two methods, extrusion and die casting. Extruded aluminum heat sinks are produced by forcing molten aluminum through a precision die to produce an article of constant cross-section. Extruded aluminum heat sinks have a thermal conductivity of about 220 W/m-K, which is useful for many thermal dissipation applications. However, extruded aluminum heat sinks are disadvantageous when the non-finned surface of the heat source has a complex shape. In other words, when it is desired to position the heat sink such that it sits on multiple components, the surface of the heat sink mating with the electronic components must conform to the differing profiles of the various components. A heat sink with a flat mating profile would not be adequate, but machining or otherwise forming a complex profile into an extruded aluminum heat sink is an expensive and time-consuming exercise.

Heat sinks formed of die cast aluminum or magnesium (or alloys thereof) can solve this problem, because die casting can be used to form a heat sink with a complex surface pattern. Die cast aluminum heat sinks are formed by injecting molten aluminum into a steel mold or die under high pressure. While the use of die cast aluminum heat sinks can provide a mating surface having complex shapes in a cost effective manner, the thermal conductivity of cast aluminum heat sinks is often only about 100 W/m-K or lower, much less than desirable for most electronic thermal management applications and less than half that of extruded aluminum heat sinks.

What is desirable, therefore, is a way to leverage the relatively high thermal conductivity of extruded aluminum heat sinks with the flexibility of shape of die cast aluminum heat sinks.

An additional method of managing thermal energy is through graphite-based components which offer thermal conductivity comparable with or better than copper or aluminum but at a fraction of the weight while providing significantly greater design flexibility. Graphite-based thermal management products take advantage of the highly directional properties of graphite to move heat away from electronic components while having thermal conductivities substantially higher than typical aluminum alloys used for heat management. Furthermore, graphite is anisotropic making it more suitable for channeling heat in a preferred direction.

Graphites are made up of layer planes of hexagonal arrays or networks of carbon atoms. These layer planes of hexagonally arranged carbon atoms are substantially flat and are oriented or ordered so as to be substantially parallel and equidistant to one another. The substantially flat, parallel equidistant sheets or layers of carbon atoms, usually referred to as graphene layers or basal planes, are linked or bonded together and groups thereof are arranged in crystallites. Highly ordered graphites consist of crystallites of considerable size, the crystallites being highly aligned or oriented with respect to each other and having well ordered carbon layers. In other words, highly ordered graphites have a high degree of preferred crystallite orientation. It should be noted that graphites possess anisotropic structures and thus exhibit or possess many properties that are highly directional such as thermal and electrical conductivity.

Briefly, graphites may be characterized as laminated structures of carbon, that is, structures consisting of superposed layers or laminae of carbon atoms joined together by weak van der Waals forces. In considering the graphite structure, two axes or directions are usually noted, to wit, the "c" axis or direction and the "a" axes or directions. For simplicity, the "c" axis or direction may be considered as the direction perpendicular to the carbon layers. The "a" axes or directions may be considered as the directions parallel to the carbon layers or the directions perpendicular to the "c" direction. The graphites suitable for manufacturing flexible graphite sheets possess a very high degree of orientation.

As noted above, the bonding forces holding the parallel layers of carbon atoms together are only weak van der Waals forces. Natural graphites can be treated so that the spacing between the superposed carbon layers or laminae can be appreciably opened up so as to provide a marked expansion in the direction perpendicular to the layers, that is, in the "c" direction, and thus form an expanded or intumesced graphite structure in which the laminar character of the carbon layers is substantially retained.

Graphite flake which has been greatly expanded and more particularly expanded so as to have a final thickness or "c"

direction dimension which is as much as about 80 or more times the original "c" direction dimension can be formed without the use of a binder into cohesive or integrated sheets of expanded graphite, e.g. webs, papers, strips, tapes, foils, mats or the like (typically referred to as "flexible graphite"). The formation of graphite particles which have been expanded to have a final thickness or "c" dimension which is as much as about 80 times or more the original "c" direction dimension into integrated flexible sheets by compression, without the use of any binding material, is believed to be possible due to the mechanical interlocking, or cohesion, which is achieved between the voluminously expanded graphite particles.

In addition to flexibility, the sheet material, as noted above, has also been found to possess a high degree of anisotropy with respect to thermal conductivity due to orientation of the expanded graphite particles and graphite layers substantially parallel to the opposed faces of the sheet resulting from high compression, making it especially useful in heat spreading applications. Sheet material thus produced has excellent flexibility, good strength and a high degree of orientation.

Briefly, the process of producing flexible, binderless anisotropic graphite sheet material, e.g. web, paper, strip, tape, foil, mat, or the like, comprises compressing or compacting under a predetermined load and in the absence of a binder, expanded graphite particles which have a "c" direction dimension which is as much as about 80 or more times that of the original particles so as to form a substantially flat, flexible, integrated graphite sheet. The expanded graphite particles that generally are worm-like or vermiform in appearance, once compressed, will maintain the compression set and alignment with the opposed major surfaces of the sheet. The density and thickness of the sheet material can be varied by controlling the degree of compression. The density of the sheet material can be within the range of from about 0.04 g/cc to about 2.0 g/cc.

The flexible graphite sheet material exhibits an appreciable degree of anisotropy due to the alignment of graphite particles parallel to the major opposed, parallel surfaces of the sheet, with the degree of anisotropy increasing upon compression of the sheet material to increase orientation. In compressed anisotropic sheet material, the thickness, i.e. the direction perpendicular to the opposed, parallel sheet surfaces comprises the "c" direction and the directions ranging along the length and width, i.e. along or parallel to the opposed, major surfaces comprises the "a" directions and the thermal and electrical properties of the sheet are very different, by orders of magnitude, for the "c" and "a" directions.

SUMMARY OF THE INVENTION

The present invention provides a heat management device which is uniquely capable of use in applications of removing thermal energy from electronic devices. The inventive heat management device provides for the dissipation of heat from electronics, even when the device must assume a complex shape for mating with the heat source.

The heat management device of the present invention reduces the required airflow necessary for cooling electrical components through forced convection by lowering the overall thermal resistance; indeed, it can also eliminate the use of fans in certain applications by improving the local convection heat flux in free convection. More specifically, the inventive thermal management device facilitates better heat transfer through improving the heat spreading in the base of the heat sink which typically represents the greatest barrier in improving the dissipation of thermal energy from a casting.

The present invention provides a compound heat sink comprising a base element which is formed of a die cast material, such as a metal like aluminum, magnesium, or alloys thereof. The base element can have a complex mating surface for mating with a heat source or plurality of heat sources having a non-planar profile (often through the agency of a conventional thermal interface material. By mating surface is meant the surface of the heat sink which is intended to be in thermal contact with the heat source(s). By thermal contact is meant sufficiently close spatial relationship such that heat generated by the heat source is transferred to the heat sink. Having a mating surface with a profile which approximates that of the heat source or heat sources can optimize thermal contact, as well as provide electromagnetic interference (EMI) shielding.

As noted, the base element is formed of die cast material. Preferably the material is a metal, and most preferably it is aluminum, due to the relatively light weight and cost effectiveness of the use of die cast aluminum. However, depending on the particular application and other factors, other metals such as magnesium, or even other materials which are solid are the working temperatures of the electronic device but capable of being die cast, can be employed.

The inventive compound heat sink also comprises a dissipation element formed of an extruded high thermal conductivity material, especially aluminum. By high thermal conductivity is meant an isotropic material having a thermal conductivity of at least about 150 (throughout) W/m-K. The dissipation element should preferably include a high surface area portion, most advantageously fins or the like for facilitating the dissipation of heat from the compound heat sink. The term "fins" as used herein, refers to structures which function to increase the effective surface area of a thermal management device, such as a heat sink, in order to improve the heat dissipation characteristics of the device, and constitute elements extending from a surface of a thermal management device such that contact between a fin and other elements of the device is at a discrete location on the fin, such that the fin is exposed to the air on all surfaces other than the discrete location at which it contacts other elements of the thermal management device. Most commonly, fins extend perpendicularly from the heat dissipation element.

In order to effect efficient heat transfer from the base element, which is in thermal contact with the heat source, and the dissipation element, from which the bulk of the heat dissipation occurs, a thermal connection must be made between the base element and the dissipation element to facilitate heat transfer between the two. The thermal connection can be made by use of a thermal interface material, such as a thermal grease or phase change material, or the like. Most advantageously, though, the thermal connection between the base element and the dissipation element is through a thermal connection material comprising a heat spreader having a thermal conductivity in the in-plane direction of greater than the thermal conductivity of the heat dissipation element, in order to improve the heat spreading from the base element to the heat dissipation element. Preferably, the thermal connection material has a thermal conductivity in the in-plane direction of at least about 200 W/m-K. More specifically, the thermal connection material can be at least one sheet of compressed particles of exfoliated graphite having an in-plane thermal conductivity of at least about 200 W/m-K, more preferably at least about 250 W/m-K. Optionally, the heat spreader can include a thermal via constructed of an isotropic material extending therethrough. Alternatively, the thermal connection material can comprise a housing which encloses an inner area, a liquid transfer medium within the inner area of the housing; and a working fluid within the inner area of the housing and partially contained in the liquid transfer medium. In yet another embodiment, copper or another high thermal conductivity material can also be employed as the thermal connection material. By use of the thermal connection material of the present invention, heat transfer from the base element to the dissipation element is made more uniform across the heat-receiving surface of the dissipation element.

In an additional embodiment, an adhesive such as an epoxy, especially a thermal epoxy, may be used to join the elements of the compound heat sink. Thus, the epoxy may be used between the base element and the thermal connection material, and/or between the thermal connection material and the dissipation element.

An object of the invention, therefore, is a heat management device having characteristics which enable it to leverage the advantages of a die cast heat sink with the advantages of an extruded heat sink, and permit it to be employed in a wide variety of electronic device applications.

Another object of the invention is a heat management device with a base element which can assume a profile matching that of the heat source(s) and a dissipation element which can optimize thermal dissipation, with a thermal connection material therebetween to facilitate uniform heat transfer and dissipation.

Still another object of the invention is a heat management device having a dissipation element with a plurality of fins, in communication with a base element through the agency of a thermal connection material, to provide for the dissipation of thermal energy received in the base element from the electronic device.

Yet another object of the invention is a heat management device which includes a thermal connection material, preferably at least one sheet of compressed particles of exfoliated graphite, which facilitates the thermal connection between a base element and a dissipation element.

Another object of the invention is the method of removing heat from an electronic device utilizing a compound heat sink which includes a die cast base element, and extruded dissipation element, and a thermal connection material therebetween, where the thermal connection material comprises graphite.

These aspects and other that will become apparent to the artisan upon review of the following description can be accomplished by providing a heat sink comprising a base element comprising a die cast material; a dissipation element comprising an extruded material having a thermal conductivity of at least about 150 W/m-K; and a thermal connection material positioned between and in thermal contact with each of the base element and the dissipation element, wherein the thermal connection material has an in-plane thermal conductivity greater than that of the dissipation element. The thermal connection material can comprise at least one sheet of compressed particles of exfoliated graphite (possibly also having a thermal via therethrough), or a high thermal conductivity material like copper, or a so-called "active" heat spreader comprising a housing which encloses an inner area, a liquid transfer medium within the inner area of the housing; and a working fluid within the inner area of the housing and partially contained in the liquid transfer medium, or combinations thereof. Preferably, the thermal connection material has an in-plane thermal conductivity of at least about 200 W/m-K.

The base element preferably comprises die cast aluminum, which can have a mating surface which assumes a complex profile, especially one which is complementary to the profile of the heat source with which it is in thermal contact. Advantageously, the dissipation element comprises extruded aluminum, which has a high surface area portion to facilitate heat dissipation. The high surface area portion of the dissipation element preferably comprises fins. A thermal epoxy can be used to adhere the thermal connection material to the base element and to adhere the thermal connection material to the dissipation element. The invention also includes an electronic device which has a heat source having a complex profile.

It is to be understood that both the forgoing general description and the following detailed description provide embodiments of the invention and are intended to provide an overview of the framework of understanding to nature and character of the invention as it is claimed.

DETAILED DESCRIPTION OF THE PREFERRED EMBODIMENT

The compound heat sink in accordance with the present invention can improve both the performance and functional lifespan of an electronic device through the reduction of the operating temperature of the device. Specifically, the invention provides for greater reduction in the temperature of the electronic device than prior art die cast devices by permitting the use of an extruded heat dissipation element with improved spreading of the heat from the base element into the dissipation element. By providing the flexibility to closely mate with heat sources of differing profiles while maintaining the thermal conduction characteristics of extruded aluminum, the inventive heat sink can optimize thermal dissipation, whether in conjunction with the use of a fan or in a free convection environment.

In configurations including the use of a fan component, forced convection occurs as the fan imposes external motion onto the air. Forced convection provides for typically better cooling as air is continuously in motion over the heat sink and provides a larger gradient of temperatures resulting in a larger thermal flux. With the improved thermal dissipation qualities of the compound heat sink of the present invention, less airflow is necessary than with a die cast heat sink, as the thermal management device is more efficient for a given airflow. As such, the fan components may be designed smaller, or eliminated altogether, resulting in a saving of space as well as electrical energy.

In instances of free convection, where the motion of the surrounding air occurs only from the density gradient of the air and not from external components, the inventive heat sink provides for a greater heat transfer across the solid to fluid interface resulting in a lower operating temperature of the electronic device. Despite free convection being less efficient than forced convection, design requirements often preclude or make undesirable the addition of fans, such as in tower infrastructure environments, where access to equipment for monitoring or repair is not convenient. As such, the lower thermal resistance of the present invention is ideal as the thermal management device still dissipates heat efficiently from the electronic device providing for a lower operating temperature.

Figure 1:
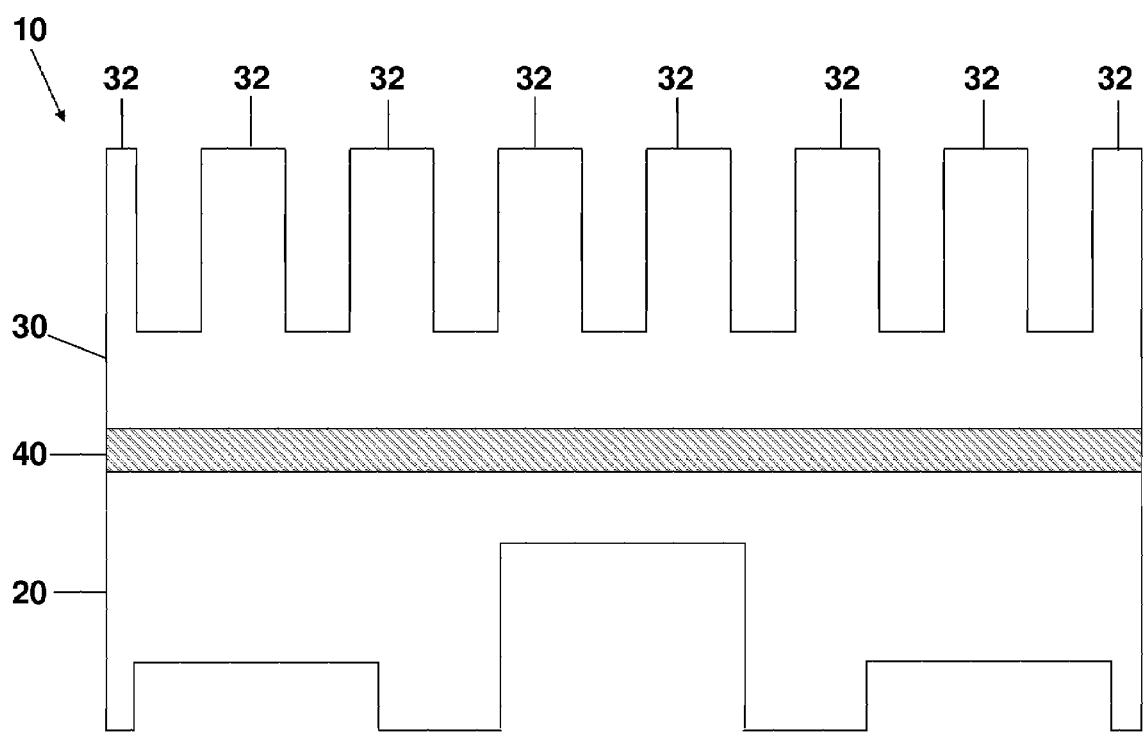
FIG. 1 is a cross-sectional schematic illustration of a general embodiment of the compound heat sink of the present invention.

The thermal management device in accordance with the present invention is prepared with three essential components. The device includes a base element which is adjacent to the electronic device providing the thermal energy, and a dissipation element having at least one fin and preferably a plurality of fins, in contact with the base element. A thermal connection material bridges the gap between the base element and dissipation element to facilitate heat transfer between the two. FIG. 1 is a schematic illustration of one embodiment of the present invention. Compound heat sink 10 includes base element 20 which is in contact with the electronic device which is to be cooled (typically through a thermal interface material). Thermal management device 10 also includes dissipation element 30 having a plurality of fins 32 which are on the opposite surface of dissipation element 30 from base element 20 (although fins 32 can be located on any surface of dissipation element 30 from which heat dissipation is desired). The fins 32 can be attached to dissipation element 30 by a variety of methods, including soldering, swaging and mechanical attachments; alternatively, an adhesive such as a thermal epoxy may be utilized to adhere each fin of plurality of fins 32 to dissipation element 30 for the subsequent dissipation of thermal energy from the heat generating electronic device. The electronic device may be a printed circuit board or other electronic devices including a computer, cell phone, PDA, or other electronic equipment, such as a telecom basestation mounted onto a tower. More particularly, the thermal management device maybe used in applications where excessive thermal energy can be diminish the performance characteristics of an electronic device, such as applications including but not limited to tower-mounted infrastructure, servers, computer processing units, graphic-processors and the like, especially where passive cooling is most desired. Furthermore, due to the continual decrease in size of electronic devices, the heat management device 10 may be located in a variety of configurations and sizes pertinent to the electronic device.

Figure 2:
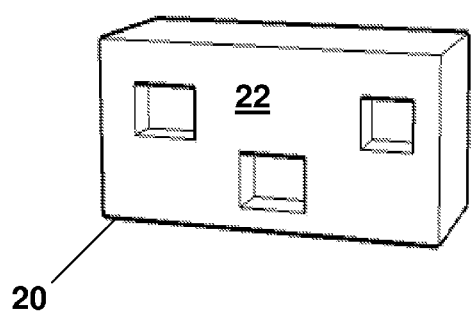
FIG. 2 is a schematic illustration of a bottom view of the base element of the compound heat sink of the present invention, showing its mating surface.

As described above, base element 20 comprises a die cast material, particularly a metal and most preferably aluminum although magnesium, or alloys or aluminum or magnesium can also be employed. Due to the nature of the die casting process, where the molten material is injected into a die, complex shapes can be formed in the die cast article, by providing a die with the complementary complex shapes. Thus, where heat dissipation from the electronic device is from a multi-element heat source, such as a collection of chips on a single printed circuit board (not shown), base element 20 can be provided with a complex shape so that it can be positioned in good thermal contact with all of the heat sources. In other words, as shown in FIGS. 1 and 2, the mating surface 22 of base element 20 can have structures or indentations that conform to the profile of the heat source, such that base element 20 can be fitted into position in thermal contact with all the heat sources for which heat dissipation through heat sink 10 is desired. In addition, the complex profile of mating surface 22 can also provide EMI shielding cavities to match with the components of a printed circuit board or the like.

Figure 3:
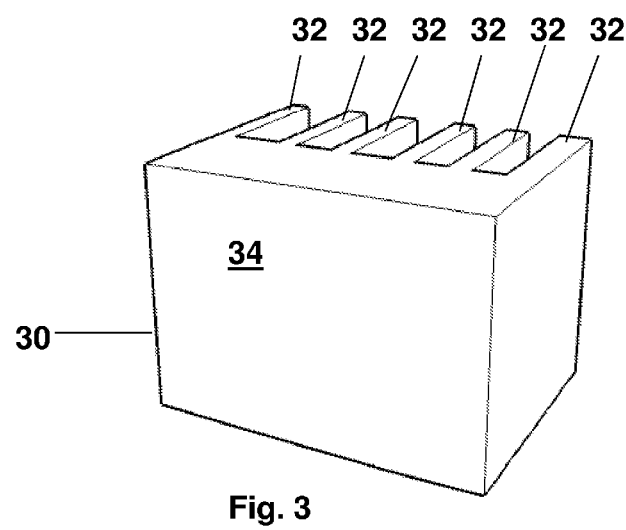
FIG. 3 is a schematic illustration of a bottom view of the dissipation element of the compound heat sink of the present invention.

Referring now to FIGS. 1 and 3, the dissipation element 30 is shown. Dissipation element 30 is formed of an extruded high thermal conductivity material. The extruded high thermal conductivity material from which dissipation element 30 is formed is preferably aluminum, and is isotropic with a thermal conductivity of at least about 150 W/m-K. Indeed, when formed of aluminum, dissipation element 30 has a thermal conductivity of about 220 W/m-K. Dissipation element 30 has a high surface area portion to facilitate heat dissipation. The high surface area portion of dissipation element 30 preferably is in the form of fins 32.

While fins 32 may be formed integrally with dissipation element 30, in one preferred embodiment of the invention, fins 32 are attached to dissipation element 30 by swaging as described by Lipinski in U.S. Pat. No. 5,406,698, the disclosure of which is incorporated herein by reference. Generally, a secure connection is made between a plurality of fins 32 and dissipation element 30 through the use of vertical and lateral pressure without the use of an epoxy.

An additional embodiment includes the use of solder to secure the fins 32 in contact with the dissipation element 30 so that thermal energy flows from the dissipation element 30 to the fins 32. Soldering is a preferred method of attachment as soldering provides superior bond strength as well as thermal contact at the connection point between the fin 32 and the dissipation element 30. One method of soldering includes applying paste in a stencil formation wherein the paste is applied through a stencil, the stencil is removed, the fins 32 are applied, and the solder is cured. Typical solder includes but is not limited to a lead-tin mixture for bonding the fins. Soldering is preferred over epoxy as soldering utilizes a paste comprised primary of two metallic elements, which have a relatively high thermal conductivity, whereas epoxies are often comprised of non-metallic materials resulting in a bond having a lower thermal conductivity. Essentially, the solder creates a true metallurgical bond between the dissipation element 30 and fins 32 thus enhancing the transfer of thermal energy from dissipation element 30 to the fins 32.

A further means of attachment includes brazing in which a molten filler metal is used to join the fins 32 to the dissipation element 30 through capillary attraction. Typically aluminum or copper are used for brazing wherein high temperatures are utilized to fill the space between the contact point of the dissipation element 30 and the fin 32.

As shown in FIG. 3, dissipation element 30 has a relatively flat or planar bottom surface 34, which is the surface into which heat is transferred form base element 20 is transferred for dissipation through fins 32. Accordingly, it is important to facilitate heat transfer between base element 20 and dissipation element 30. In order to ensure thermal transfer between base element 20 and dissipation element 30 is optimized, a thermal connection material 40 is disposed between base element 20 and dissipation element 30, as illustrated in FIG. 1.

While thermal connection material 40 can be a thermal interface material, of the type familiar to the skilled artisan, preferably thermal connection material comprises a high thermal conductivity heat spreader, that is, an anisotropic material having an in-plane thermal conductivity of greater than the thermal conductivity of the heat dissipation element 30, and preferably at least about 200 W/m-K, more preferably at least about 250 W/m-K. Thermal connection material 40 can comprise a high thermal conductivity material like copper but, most preferably, thermal connection material comprises at least one sheet of compressed particles of exfoliated graphite.

A preferred method for manufacturing sheets of compressed particles of exfoliated graphite is described by Shane et al. in U.S. Pat. No. 3,404,061, the disclosure of which is incorporated herein by reference, with Norley et al. in U.S. Pat. No. 6,613,252 describing a resin impregnated graphite article and method of manufacturing which is also incorporated herein by reference.

In one embodiment of the practice of the Shane et al. method, natural graphite flakes are intercalated by dispersing the flakes in a solution containing e.g., a mixture of nitric and sulfuric acid, advantageously at a level of about 20 to about 300 parts by weight of intercalate solution per 100 parts by weight of graphite flakes (pph). The intercalation solution contains oxidizing and other intercalating agents known in the art. Examples include those containing oxidizing agents and oxidizing mixtures, such as solutions containing nitric acid, potassium chlorate, chromic acid, potassium permanganate, potassium chromate, potassium dichromate, perchloric acid, and the like, or mixtures, such as for example, concentrated nitric acid and chlorate, chromic acid and phosphoric acid, sulfuric acid and nitric acid, or mixtures of a strong organic acid, e.g. trifluoroacetic acid, and a strong oxidizing agent soluble in the organic acid. Alternatively, an electric potential can be used to bring about oxidation of the graphite. Chemical species that can be introduced into the graphite crystal using electrolytic oxidation include sulfuric acid as well as other acids.

The intercalating agent is a solution of a mixture of sulfuric acid, or sulfuric acid and phosphoric acid, and an oxidizing agent, i.e. nitric acid, perchloric acid, chromic acid, potassium permanganate, hydrogen peroxide, iodic or periodic acids, or the like. Although less preferred, the intercalation solution may contain metal halides such as ferric chloride, and ferric chloride mixed with sulfuric acid, or a halide, such as bromine as a solution of bromine and sulfuric acid or bromine in an organic solvent.

The quantity of intercalation solution may range from about 20 to about 150 pph and more typically about 50 to about 120 pph. After the flakes are intercalated, any excess solution is drained from the flakes and the flakes are water-washed. Alternatively, the quantity of the intercalation solution may be limited to between about 10 and about 50 pph, which permits the washing step to be eliminated as taught and described in U.S. Pat. No. 4,895,713, the disclosure of which is also herein incorporated by reference.

The particles of graphite flake treated with intercalation solution can optionally be contacted, e.g. by blending, with a reducing organic agent selected from alcohols, sugars, aldehydes and esters which are reactive with the surface film of oxidizing intercalating solution at temperatures in the range of 25° C. and 125° C. Suitable specific organic agents include hexadecanol, octadecanol, 1-octanol, 2-octanol, decylalcohol, 1,10 decanediol, decylaldehyde, 1-propanol, 1,3 propanediol, ethyleneglycol, polypropylene glycol, dextrose, fructose, lactose, sucrose, potato starch, ethylene glycol monostearate, diethylene glycol dibenzoate, propylene glycol monostearate, glycerol monostearate, dimethyl oxylate, diethyl oxylate, methyl formate, ethyl formate, ascorbic acid and lignin-derived compounds, such as sodium lignosulfate. The amount of organic reducing agent is suitably from about 0.5 to 4% by weight of the particles of graphite flake.

The use of an expansion aid applied prior to, during or immediately after intercalation can also provide improvements. Among these improvements can be reduced exfoliation temperature and increased expanded volume (also referred to as "worm volume"). An expansion aid in this context will advantageously be an organic material sufficiently soluble in the intercalation solution to achieve an improvement in expansion. More narrowly, organic materials of this type that contain carbon, hydrogen and oxygen, preferably exclusively, may be employed. Carboxylic acids have been found especially effective. A suitable carboxylic acid useful as the expansion aid can be selected from aromatic, aliphatic or cycloaliphatic, straight chain or branched chain, saturated and unsaturated monocarboxylic acids, dicarboxylic acids and polycarboxylic acids which have at least 1 carbon atom, and preferably up to about 15 carbon atoms, which is soluble in the intercalation solution in amounts effective to provide a measurable improvement of one or more aspects of exfoliation. Suitable organic solvents can be employed to improve solubility of an organic expansion aid in the intercalation solution.

Representative examples of saturated aliphatic carboxylic acids are acids such as those of the formula $H(CH_2)_n COOH$ wherein n is a number of from 0 to about 5, including formic, acetic, propionic, butyric, pentanoic, hexanoic, and the like. In place of the carboxylic acids, the anhydrides or reactive carboxylic acid derivatives such as alkyl esters can also be employed. Representative of alkyl esters are methyl formate and ethyl formate. Sulfuric acid, nitric acid and other known aqueous intercalants have the ability to decompose formic acid, ultimately to water and carbon dioxide. Because of this, formic acid and other sensitive expansion aids are advantageously contacted with the graphite flake prior to immersion of the flake in aqueous intercalant. Representative of dicarboxylic acids are aliphatic dicarboxylic acids having 2-12 carbon atoms, in particular oxalic acid, fumaric acid, malonic acid, maleic acid, succinic acid, glutaric acid, adipic acid, 1,5-pentanedicarboxylic acid, 1,6-hexanedicarboxylic acid, 1,10-decanedicarboxylic acid, cyclohexane-1,4-dicarboxylic acid and aromatic dicarboxylic acids such as phthalic acid or terephthalic acid. Representative of alkyl esters are dimethyl oxylate and diethyl oxylate. Representative of cycloaliphatic acids is cyclohexane carboxylic acid and of aromatic carboxylic acids are benzoic acid, naphthoic acid, anthranilic acid, p-aminobenzoic acid, salicylic acid, o-, m- and p-tolyl acids, methoxy and ethoxybenzoic acids, acetoacetamidobenzoic acids and, acetamidobenzoic acids, phenylacetic acid and naphthoic acids. Representative of hydroxy aromatic acids are hydroxybenzoic acid, 3-hydroxy-1-naphthoic acid, 3-hydroxy-2-naphthoic acid, 4-hydroxy-2-naphthoic acid, 5-hydroxy-1-naphthoic acid, 5-hydroxy-2-naphthoic acid, 6-hydroxy-2-naphthoic acid and 7-hydroxy-2-naphthoic acid. Prominent among the polycarboxylic acids is citric acid.

The intercalation solution will be aqueous and will preferably contain an amount of expansion aid of from about 1 to 10%, the amount being effective to enhance exfoliation. In the embodiment wherein the expansion aid is contacted with the graphite flake prior to or after immersing in the aqueous intercalation solution, the expansion aid can be admixed with the graphite by suitable means, such as a V-blender, typically in an amount of from about 0.2% to about 10% by weight of the graphite flake.

After intercalating the graphite flake, and following the blending of the intercalant coated intercalated graphite flake with the organic reducing agent, the blend is exposed to temperatures in the range of 25° to 125° C. to promote reaction of the reducing agent and intercalant coating. The heating period is up to about 2 hours, with shorter heating periods, e.g., at least about 10 minutes, for higher temperatures in the above-noted range. Times of one-half hour or less, e.g., on the order of 10 to 25 minutes, can be employed at the higher temperatures.

The above described methods for intercalating and exfoliating graphite flake may beneficially be augmented by a pretreatment of the graphite flake at graphitization temperatures, i.e. temperatures in the range of about 3000° C. and above and by the inclusion in the intercalant of a lubricious additive.

The pretreatment, or annealing, of the graphite flake results in significantly increased expansion (i.e., increase in expansion volume of up to 300% or greater) when the flake is subsequently subjected to intercalation and exfoliation. Indeed, the increase in expansion is at least about 50%, as compared to similar processing without the annealing step.

The temperatures employed for the annealing step should not be significantly below 3000° C., because temperatures even 100° C. lower result in substantially reduced expansion.

The annealing is performed for a period of time sufficient to result in a flake having an enhanced degree of expansion upon intercalation and subsequent exfoliation. Typically the time required will be 1 hour or more, preferably 1 to 3 hours and will most advantageously proceed in an inert environment. For maximum beneficial results, the annealed graphite flake will also be subjected to other processes known in the art to enhance the degree expansion—namely intercalation in the presence of an organic reducing agent, an intercalation aid such as an organic acid, and a surfactant wash following intercalation. Moreover, for maximum beneficial results, the intercalation step may be repeated.

The annealing step may be performed in an induction furnace or other such apparatus as is known and appreciated in the art of graphitization; for the temperatures here employed, which are in the range of 3000° C., are at the high end of the range encountered in graphitization processes.

Because it has been observed that the worms produced using graphite subjected to pre-intercalation annealing can sometimes "clump" together, which can negatively impact area weight uniformity, an additive that assists in the formation of "free flowing" worms is highly desirable. The addition of a lubricious additive to the intercalation solution facilitates the more uniform distribution of the worms across the bed of a compression apparatus (such as the bed of a calender station conventionally used for compressing, or "calendering," graphite worms into an integrated graphite article). The resulting article therefore has higher area weight uniformity and greater tensile strength. The lubricious additive is preferably a long chain hydrocarbon, more preferably a hydrocarbon having at least about 10 carbons. Other organic compounds having long chain hydrocarbon groups, even if other functional groups are present, can also be employed.

More preferably, the lubricious additive is an oil, with a mineral oil being most preferred, especially considering the fact that mineral oils are less prone to rancidity and odors, which can be an important consideration for long term storage. It will be noted that certain of the expansion aids detailed above also meet the definition of a lubricious additive. When these materials are used as the expansion aid, it may not be necessary to include a separate lubricious additive in the intercalant.

The lubricious additive is present in the intercalant in an amount of at least about 1.4 pph, more preferably at least about 1.8 pph. Although the upper limit of the inclusion of lubricous additive is not as critical as the lower limit, there does not appear to be any significant additional advantage to including the lubricious additive at a level of greater than about 4 pph.

The thus treated particles of graphite are sometimes referred to as "particles of intercalated graphite." Upon exposure to high temperature, e.g. temperatures of at least about 160° C. and especially about 700° C. to 1200° C. and higher, the particles of intercalated graphite expand as much as about 80 to 1000 or more times their original volume in an accordion-like fashion in the c-direction, i.e. in the direction perpendicular to the crystalline planes of the constituent graphite particles. The expanded, i.e. exfoliated, graphite particles are vermiform in appearance, and are therefore commonly referred to as worms. The worms may be compressed together into articles that, unlike the original graphite flakes, can be formed and cut into various shapes and provided with small transverse openings by deforming mechanical impact as hereinafter described.

The graphite materials prepared as described are coherent, with good handling strength, and are suitably compressed, e.g. by molding or roll-pressing, to a thickness of about 0.075 mm to 30 mm and a typical density of about 0.1 to 1.5 grams per cubic centimeter (g/cc). From about 1.5-30% by weight of ceramic additives can be blended with the intercalated graphite flakes as described in U.S. Pat. No. 5,902,762 (which is incorporated herein by reference) to provide enhanced resin impregnation in the final graphite product. The additives include ceramic fiber particles having a length of about 0.15 to 1.5 millimeters. The width of the particles is suitably from about 0.04 to 0.004 mm. The ceramic fiber particles are non-reactive and non-adhering to graphite and are stable at temperatures up to about 1100° C., preferably about 1400° C. or higher. Suitable ceramic fiber particles are formed of macerated quartz glass fibers, carbon and graphite fibers, zirconia, boron nitride, silicon carbide and magnesia fibers, naturally occurring mineral fibers such as calcium metasilicate fibers, calcium aluminum silicate fibers, aluminum oxide fibers and the like.

As noted above, the graphite materials are also treated with resin and the absorbed resin, after curing, enhances the moisture resistance and handling strength, i.e. stiffness, of the material as well as "fixing" the morphology of the sheet. The amount of resin within the epoxy impregnated graphite articles should be an amount sufficient to ensure that the final cured structure is dense and cohesive, yet the anisotropic thermal conductivity associated with a densified graphite structure is preserved or improved. Suitable resin content is preferably at least about 3% by weight, more preferably about 5 to 35% by weight, and suitably up to about 60% by weight. Resins found especially useful in the practice of the present invention include acrylic-, epoxy- and phenolic-based resin systems, fluoro-based polymers, or mixtures thereof. Suitable epoxy resin systems include those based on diglycidyl ether of bisphenol A (DGEBA) and other multifunctional resin systems; phenolic resins that can be employed include resole and novolac phenolics. Optionally, the flexible graphite may be impregnated with fibers and/or salts in addition to the resin or in place of the resin. Additionally, reactive or non-reactive additives may be employed with the resin system to modify properties (such as tack, material flow, hydrophobicity, etc.).

In a typical resin impregnation step, the flexible graphite material is passed through a vessel and impregnated with the resin system from, e.g. spray nozzles, the resin system advantageously being "pulled through the mat" by means of a vacuum chamber. Typically, but not necessarily, the resin system is solvated to facilitate application into the flexible graphite. The resin is thereafter preferably dried, reducing the tack of the resin and the resin-impregnated article.

Typically, after intercalation the particles are exfoliated by heating the intercalated particles in a furnace. During this exfoliation step, intercalated natural graphite flakes may be added to the recycled intercalated particles. Preferably, during the re-expansion step the particles are expanded to have a specific volume in the range of at least about 100 cc/g and up to about 350 cc/g or greater. Finally, after the re-expansion step, the re-expanded particles may be compressed into coherent materials and impregnated with resin, as described.

Graphite materials prepared according to the foregoing description are generally referred to as compressed particles of exfoliated graphite. Since the materials may be resin-impregnated, in such cases the resin in the sheets needs to be cured before the sheets are used in their intended applications, such as for electronic thermal management.

In one advantageous cure process, when the graphite sheets are resin-impregnated, the impregnated materials are cut to suitable-sized pieces and placed in a press, where the resin is cured at an elevated temperature. The temperature should be sufficient to ensure that the lamellar structure is densified at the curing pressure, while the thermal properties of the structure are not adversely impacted. Generally, this will require a temperature of at least about 90° C., and generally up to about 200° C. Most preferably, cure is at a temperature of from about 150° C. to 200° C. The pressure employed for curing will be somewhat a function of the temperature utilized, but will be sufficient to ensure that the lamellar structure is densified without adversely impacting the thermal properties of the structure. Generally, for convenience of manufacture, the minimum required pressure to densify the structure to the required degree will be utilized. Such a pressure will generally be at least about 7 megapascals (Mpa, equivalent to about 1000 pounds per square inch), and need not be more than about 35 Mpa (equivalent to about 5000 psi), and more commonly from about 7 to about 21 Mpa (1000 to 3000 psi). The curing time may vary depending on the resin system and the temperature and pressure employed, but generally will range from about 0.5 hours to 2 hours. After curing is complete, the composites are seen to have a density of at least about 1.8 g/cm$^3$ and commonly from about 1.8 g/cm$^3$ to 2.0 g/cm$^3$.

Although the formation of sheets through calendering or molding is the most common method of formation of the graphite materials useful in the practice of the present invention, other forming methods can also be employed. For instance, the exfoliated graphite particles can be compression molded into a net shape or near net shape.

As noted, when thermal connection material 40 comprises at least one sheet of compressed particles of exfoliated graphite, it can also have a thermal via extending therethrough (not shown). By thermal via is meant a thermal pathway which extends through thermal connection material 40, and into contact with base element 20. The via comprises a slug or "rivet" of a high thermal conductivity material, such as copper or alloys thereof, although other high thermal conductivity materials like aluminum or compressed particles of exfoliated graphite can be used. By "high thermal conductivity" is meant that the thermal conductivity of the thermal via in the direction between base element 20 and dissipation element 30 is greater than the through-thickness thermal conductivity of thermal connection material 40 and is most preferably above 350 W/m° K. The via can assume any particular cross-sectional shape, although most commonly, it will cylindrical in shape. If electrical isolation is required a dielectric layer, such as anodized aluminum, aluminum nitride, aluminum oxide or alumina, can be placed onto some or all surfaces of the via, like flame-sprayed or vapor deposited alumina on copper, or through the use of anodized aluminum as the thermal via, for example.

In another embodiment, as discussed above, thermal connection material 40 can comprise a so-called "active" heat spreader (not shown) comprising a housing which encloses an inner area, a liquid transfer medium within the inner area of the housing; and a working fluid within the inner area of the housing and partially contained in the liquid transfer medium. More specifically, such an active heat spreader includes a housing which encloses an inner area within the fin; disposed within the inner area of the housing of the fin is a working fluid which cycles between liquid and vapor phase. Furthermore, a liquid transfer medium, preferably a wick with a high wettability, can be within the inner area of the housing in a location so as to be most near the edge of the housing in communication with the base element 20. The liquid transfer medium contains a substantial portion of the liquid working fluid thereby keeping the liquid working fluid in close proximity to the base element 20. Advantageously, upon sufficient thermal energy, the liquid working fluid contained within the liquid transfer medium converts to vapor and migrates to a lower temperature region. Following, the vapor condenses within the lower temperature region and flows back to the liquid transfer medium due to capillary force, gravity or both.

Thermal epoxy may be utilized to adhere the thermal connection material 40 to the base element 20, and the thermal connection material 40 to the dissipation element 30, thus forming compound heat sink 10 of the present invention. The epoxy may include carbonaceous elements or metallic elements so as to provide for improved thermal conduction between and among base element 20, thermal connection material 40 and dissipation element 30. Furthermore, the epoxy may include a variety of resins both phenolic and polymeric resins as well as ceramic articles and combinations thereof.

By use of sheets of compressed particles of exfoliated graphite as the thermal connection material 40, heat transfer between base element 20 and dissipation element 30 is made uniform and more consistent, and maximized. In this way, an effective thermal connection between base element 20 and dissipation element 30 is created. Thus, the compound heat sink 10 enables advantageous use of the advantages of die cast aluminum, i.e., the ability to form complex mating surfaces in a cost effective manner, while substantially overcoming the relative low thermal conductivity of die cast materials, and provides sufficient base spreading to enable advantageous use of the relatively high thermal conductivity of extruded materials, while substantially overcoming the difficulty in forming complex mating surfaces in extruded materials.

The disclosures of all cited patents and publications referred to in this application are incorporated herein by reference.

The above description is intended to enable the person skilled in the art to practice the invention. It is not intended to detail all of the possible variations and modifications that will become apparent to the skilled worker upon reading the description. It is intended, however, that all such modifications and variations be included within the scope of the invention that is defined by the following claims. The claims are intended to cover the indicated elements and steps in any arrangement or sequence that is effective to meet the objectives intended for the invention, unless the context specifically indicates the contrary.

What is claimed is:

1. A heat sink comprising:
   a) a base element comprising a die cast material;
   b) a dissipation element comprising an extruded material having a thermal conductivity of at least about 150 W/m-K; and
   c) a thermal connection material which comprises at least one sheet of compressed particles of exfoliated graphite, the thermal connection material positioned between and in thermal contact with each of the base element and the dissipation element, wherein the thermal connection material has an in-plane thermal conductivity greater than the thermal conductivity of the dissipation element and the base element has a thermal conductivity lower than the thermal conductivity of the dissipation element.

2. The heat sink of claim 1, wherein the at least one sheet of compressed particles of exfoliated graphite has an in-plane thermal conductivity of at least about 200 W/m-K.

3. The heat sink of claim 1, wherein the at least one sheet of compressed particles of exfoliated graphite has a thermal via extending therethough.

4. The heat sink of claim 1, wherein the base element comprises die cast aluminum.

5. The heat sink of claim 4, wherein the base element comprises a mating surface which assumes a complex profile.

6. The heat sink of claim 1, wherein the dissipation element comprises extruded aluminum.

7. The heat sink of claim 1, wherein the dissipation element has a high surface area portion to facilitate heat dissipation.

8. The heat sink of claim 7, wherein the high surface area portion of the dissipation element comprises fins.

9. The heat sink of claim 1, wherein a thermal epoxy is used to adhere the thermal connection material to the base element and to adhere the thermal connection material to the dissipation element.

10. An electronic device comprising:
a) a heat source having a complex profile; and
b) a heat sink in thermal contact with the heat source, the heat sink comprising:
   i) a base element comprising a die cast material;
   ii) a dissipation element comprising an extruded material having a thermal conductivity of at least about 150 W/m-K; and
   iii) a thermal connection material which comprises at least one sheet of compressed particles of exfoliated graphite, the thermal connection material positioned between and in thermal contact with each of the base element and the dissipation element, wherein the thermal connection material has an in-plane thermal conductivity greater than the thermal conductivity of the dissipation element and the base element has a thermal conductivity lower than the thermal conductivity of the dissipation element.

11. The device of claim 10, wherein the at least one sheet of compressed particles of exfoliated graphite has an in-plane thermal conductivity of at least about 200 W/m-K.

12. The device of claim 10, wherein the base element comprises die cast aluminum.

13. The device of claim 12, wherein the base element comprises a mating surface which assumes a complex profile which is complementary to the profile of the heat source.

14. The device of claim 10, wherein the dissipation element comprises extruded aluminum.

15. The device of claim 10, wherein the dissipation element has a high surface area portion to facilitate heat dissipation.

16. The device of claim 15, wherein the high surface area portion of the dissipation element comprises fins.

17. The device of claim 10, wherein a thermal epoxy is used to adhere the thermal connection material to the base element and to adhere the thermal connection material to the dissipation element.

18. A heat sink comprising:
a) a base element comprising a die cast material;
b) a dissipation element comprising an extruded material having a thermal conductivity of at least about 150 W/m-K; and
c) a thermal connection material which comprises a housing which encloses an inner area, a liquid transfer medium within the inner area of the housing; and a working fluid within the inner area of the housing and partially contained in the liquid transfer medium, the thermal connection material positioned between and in thermal contact with each of the base element and the dissipation element,
wherein the thermal connection material has an in-plane thermal conductivity greater than the thermal conductivity of the dissipation element.

19. The heat sink of claim 18, wherein the base element comprises die cast aluminum.

20. The heat sink of claim 19, wherein the base element comprises a mating surface which assumes a complex profile.

21. The heat sink of claim 18, wherein the dissipation element comprises extruded aluminum.

22. The heat sink of claim 18, wherein the dissipation element has a high surface area portion to facilitate heat dissipation.

23. The heat sink of claim 22, wherein the high surface area portion of the dissipation element comprises fins.

24. The heat sink of claim 18, wherein a thermal epoxy is used to adhere the thermal connection material to the base element and to adhere the thermal connection material to the dissipation element.

* * * * *